United States Patent
Ivanov

(10) Patent No.: US 7,088,182 B2
(45) Date of Patent: Aug. 8, 2006

(54) CLASS AB OUTPUT STAGE CIRCUIT WITH STABLE QUIESCENT CURRENT

(75) Inventor: Vadim V. Ivanov, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 76 days.

(21) Appl. No.: 10/819,424

(22) Filed: Apr. 7, 2004

(65) Prior Publication Data

US 2005/0225392 A1    Oct. 13, 2005

(51) Int. Cl.
    *H03F 3/26* (2006.01)
(52) U.S. Cl. .................... 330/265; 330/85
(58) Field of Classification Search ........ 330/265, 330/264, 269, 270, 271, 85, 86, 110
    See application file for complete search history.

(56) References Cited

U.S. PATENT DOCUMENTS

| 4,331,930 A | * | 5/1982 | Shibata et al. ............ 330/267 |
| 4,800,339 A | * | 1/1989 | Tanimoto et al. .......... 330/253 |
| 5,039,953 A | * | 8/1991 | Su ............................ 330/264 |
| 6,265,941 B1 | * | 7/2001 | Lopata ...................... 330/258 |

* cited by examiner

*Primary Examiner*—Henry Choe
(74) *Attorney, Agent, or Firm*—W. James Brady, III; Frederick J. Telecky, Jr.

(57) ABSTRACT

A class-AB output stage circuit is configured with controllable reference voltages for providing stable quiescent current. An exemplary output stage circuit comprises one or more control circuits, such as feedback loops, configured to control and/or adjust the reference voltages within the class-AB circuit based on the output voltage and/or supply rail voltage levels. In addition, an exemplary output stage circuit can also comprise one or more clamp circuits configured to facilitate operation of the output stage circuit when the output supply is proximate to or exceeds a positive or a negative supply rail.

21 Claims, 3 Drawing Sheets

CLASS AB OUTPUT STAGE CIRCUIT WITH STABLE QUIESCENT CURRENT

FIELD OF INVENTION

The present invention relates to operational amplifiers. More particularly, the present invention relates to a Class AB output stage circuit with stable quiescent current as may be used within operational amplifiers.

BACKGROUND OF THE INVENTION

The demand for improved operational amplifiers, and in particular low voltage, high-speed operational amplifier circuits continues to increase. Such operational amplifier circuits generally include an input stage circuit and an output stage circuit comprised of various amplifier devices and other current sources.

Output stage circuits are generally configured to provide a particular load impedance with a desired output voltage $V_{OUT}$ and current $I_{OUT}$. The typical main objectives of output stage circuits are to provide negative and positive output currents at high current efficiency, an output voltage range that efficiently uses the full rail-to-rail range, i.e., from the negative supply rail to the positive supply rail, low distortion, and good high-frequency performance. Class-AB biasing is often used to improve performance of output stage circuits due to the ability to eliminate crossover distortion by biasing the output transistors at a small, but finite, current.

With reference to FIG. 1, a conventional class-AB output stage circuit 100 comprises a pair of gate bias voltage circuits 102 and 104 and a class-AB biasing circuit 106 for driving an output buffer 108 comprising output transistors $OUT_1$ and $OUT_2$. Gate bias voltage circuit 102 comprises a pair of diode-connected transistors $M_1$ and $M_2$ coupled to an upper-supply rail $V_{DD}$ and configured with a current source $I_3$ to generate a voltage reference $V_{REF1}$, and gate bias voltage circuit 104 comprises a pair of diode-connected transistors $M_3$ and $M_4$ coupled to a lower-supply rail $V_{SS}$ and configured with a current source $I_4$ to generate a voltage reference $V_{REF2}$. Class-AB biasing circuit 106 comprises transistors $M_5$ and $M_6$ configured with current sources $I_1$ and $I_2$ to drive output transistors $OUT_1$ and $OUT_2$, respectively. Gate bias reference voltages $V_{REF1}$ and $V_{REF2}$ drive gates of transistors $M_5$ and $M_6$, respectively. The overall speed of output stage circuit 100 is limited by the size of output transistors $OUT_1$ and $OUT_2$; thus, output transistors $OUT_1$ and $OUT_2$ need to be as short as possible, i.e., have short channel lengths, to improve the overall speed and/or capacitive load handling capability.

During operation of output stage circuit 100, as output transistor $OUT_1$ attempts to shut down, and as the gate voltage of transistor $M_5$ approaches voltage reference $V_{REF1}$, transistor $M_5$ will begin to conduct current, i.e., as the gate of transistor $M_5$ becomes biased, current will begin to flow through transistor $M_5$. However, when such current flows through transistor $M_5$, output transistor $OUT_1$ is prevented from completely shutting down. It is also critical for the various transistors to be suitably matched to facilitate a stable quiescent current, e.g., transistor $M_1$ has to match transistor $OUT_1$ and transistor $M_2$ has to match $M_5$ for the PMOS-side of output stage circuit 100, and transistor $M_4$ has to match transistor $OUT_2$ and transistor $M_3$ has to match $M_6$ for the NMOS-side of output stage circuit 100.

The need for matching arises partly in that the gate-source voltage of transistor $M_5$ plus the gate-source voltage of output transistor $OUT_1$ equals the gate-source voltage of transistor $M_1$ plus the gate-source voltage of transistor $M_2$; however, while the operation of transistors $M_1$ and $M_2$ is a function of constant current source $I_3$, and the operation of transistor $OUT_1$ is a function of its drain-source voltage and $I_q$ (both which vary during operation), the operation of transistor $M_5$ is not a function of output voltage supply. For example, with additional reference to FIG. 2, curves representing drain currents $I_D$ of output transistors $OUT_1$ and/or $OUT_2$ versus output voltage $V_{OUT}$ are illustrated. As can be realized, as output voltage $V_{OUT}$ increases, quiescent current $I_q$ changes at an even higher rate, instead of remaining within a desired stable region 202.

Accordingly, a real concern with output stage circuit 100 is that reference voltages $V_{REF1}$ and $V_{REF2}$, which dictate operation of transistor $M_5$ within class-AB circuit 106, do not depend on output voltage $V_{OUT}$ or supply rails $V_{DD}$ and $V_{SS}$. Further, matching between transistors is affected by changes in supply rails $V_{DD}$ and $V_{SS}$ and output voltage $V_{OUT}$, i.e., as supply rails $V_{DD}$ and $V_{SS}$ change, quiescent current $I_q$ can change as well. This scenario can significantly impact operation of output stage circuit 100 since quiescent current $I_q$ can comprise the majority of the total current budget. Thus, for example, in applications utilizing approximately 0.6 μm processes and requiring minimum-length output transistors $OUT_1$ and $OUT_2$, the change in quiescent current $I_q$ can be more than twice the variation of supply rails $V_{DD}$ and $V_{SS}$, and even greater, e.g., four times or more, for finer processes requiring even shorter channel lengths for output transistors $OUT_1$ and $OUT_2$.

SUMMARY OF THE INVENTION

In accordance with various aspects of the present invention, a class-AB output stage circuit is configured with controllable reference voltages for providing stable quiescent current. Stable quiescent current can allow for a decrease in the overall current budget of an operational amplifier circuit.

In accordance with an exemplary embodiment, an output stage circuit comprises one or more control circuits, such as feedback loops, configured to control and/or adjust the reference voltages within the class-AB circuit based on the output voltage and/or supply rail voltage levels. For example, an exemplary feedback loop can be configured within a PMOS-side and/or NMOS-side of an output stage circuit. In accordance with an exemplary embodiment, the exemplary control circuits can comprise a feedback element coupled to output devices to generate output-dependent reference voltages. In addition, an exemplary control circuit can also be coupled to one or more supply rails to provide a supply rail-dependent reference voltage.

In accordance with another exemplary embodiment, an exemplary output stage circuit can comprise one or more clamp circuits configured to facilitate operation of the output stage circuit when the output supply is proximate to or exceeds a positive or a negative supply rail. For example, an exemplary clamp circuit can be configured to enable operation of an exemplary control circuit when the output supply is within the supply rail voltages, and to prevent current saturation when the output supply reaches or exceeds the supply rail voltages and disables the exemplary feedback loop.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components. It should be appreciated that such functional components may be realized by any number of hardware components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. However for purposes of illustration only, exemplary embodiments of the present invention will be described herein in connection with an output stage circuit as may be used in an operational amplifier. Further, it should be noted that while various components may be suitably coupled or connected to other components within exemplary circuits, such connections and couplings can be realized by direct connection between components, or by connection through other components and devices located thereinbetween.

In accordance with various aspects of the present invention, a class-AB output stage circuit is configured with controllable reference voltages for providing stable quiescent current. An exemplary output stage circuit can be configured with various types of input stage circuits within various configurations of operational amplifier circuits. Providing for a stable quiescent current can allow for a decrease in the overall current budget of an operational amplifier circuit.

Figure 1:
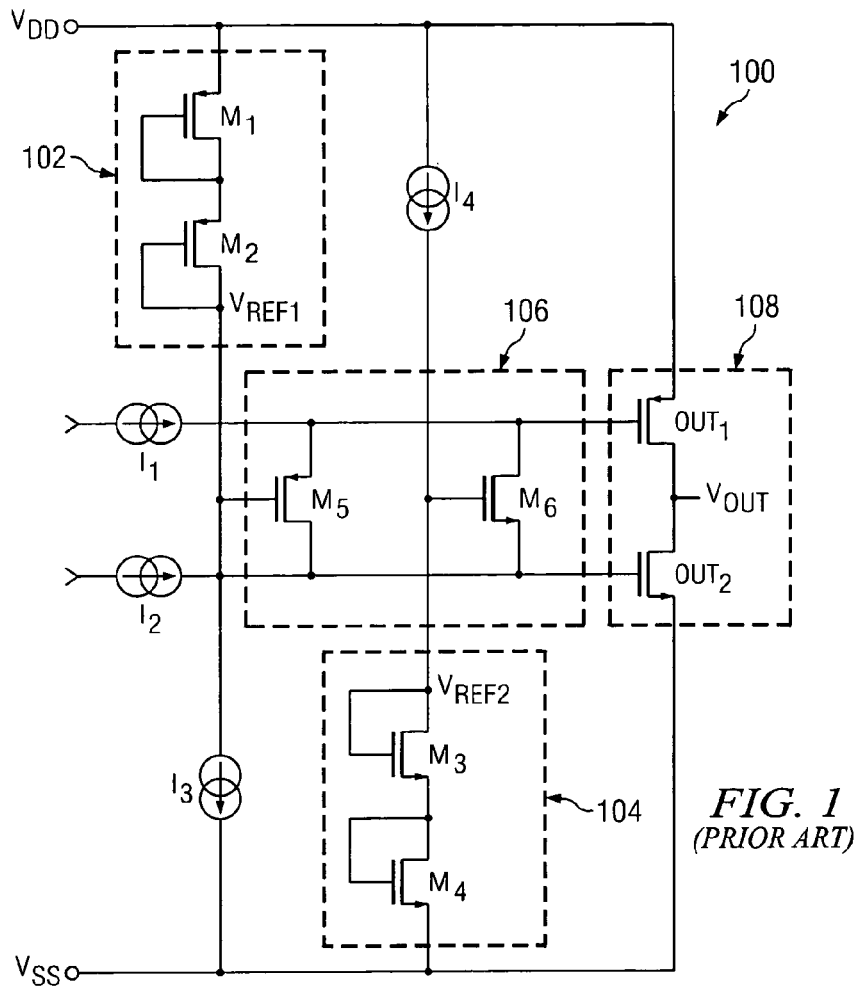
FIG. 1 illustrates a schematic diagram of a prior art output stage circuit.
Figure 2:
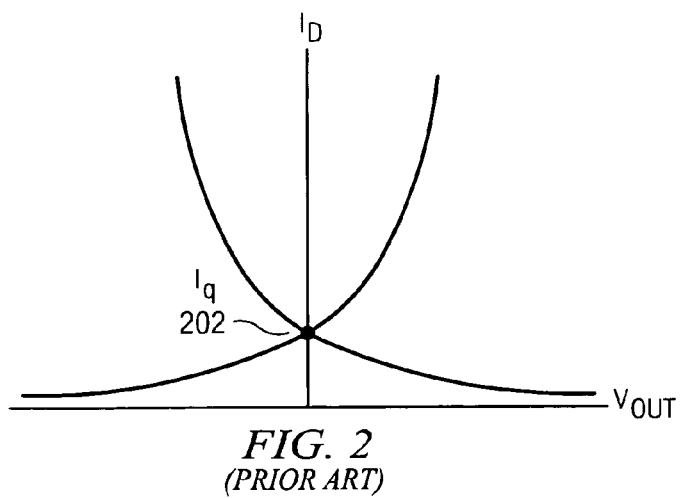
FIG. 2 illustrates an output supply diagram from a prior art output stage circuit.
Figure 3:
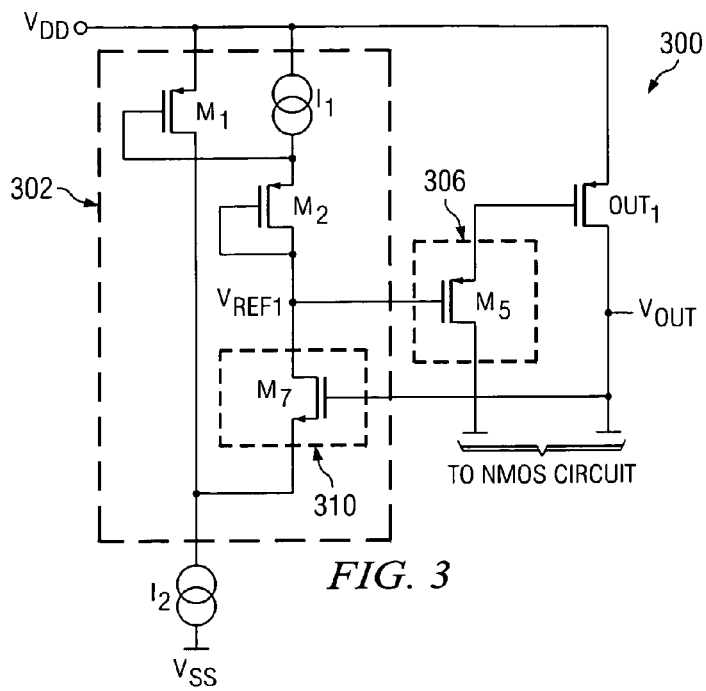
FIG. 3 illustrates a schematic diagram of an exemplary PMOS-side of an output stage circuit in accordance with an exemplary embodiment of the present invention.

In accordance with an exemplary embodiment, an output stage circuit comprises one or more control circuits, for example feedback loops, configured to control and/or adjust the reference voltages within the class-AB circuit based on the output voltage and/or supply rail voltage levels. An exemplary control circuit comprising a feedback loop can be configured with a PMOS-side and/or NMOS-side of an output stage circuit. For example, with reference to an exemplary embodiment illustrated in FIG. 3, a PMOS-circuit 300 for an output stage circuit comprises a feedback loop 302 and an output device $OUT_1$. A class-AB circuit 306 is configured within feedback loop 302 and comprises a transistor device $M_5$ configured to drive output device $OUT_1$, and can be configured in various manners with one or more additional components for class-AB biasing. Output device $OUT_1$ can comprise various output buffer configurations for an output stage circuit. Output device $OUT_1$ can also comprise any length device; however, in accordance with an exemplary embodiment, output device $OUT_1$ comprises a minimum-length device to further facilitate higher speed and/or capacitive load handling capability.

In accordance with an exemplary embodiment, an exemplary feedback loop 302 can comprise at least one feedback element 310 coupled to output device $OUT_1$ to generate an output-dependent reference voltage $V_{REF1}$. In the exemplary embodiment, feedback element 310 comprises a transistor $M_7$ having a control (gate) terminal coupled to an output (drain) terminal of output device $OUT_1$, i.e., coupled to output voltage $V_{OUT}$, to provide feedback from the output supply. In addition, an exemplary feedback loop 302 can also be coupled to one or more supply rails to provide a supply rail-dependent reference voltage. For example, feedback loop 302 of PMOS-circuit 300 can further comprise a transistor $M_1$ and a transistor $M_2$ configured with a current source $I_1$ to facilitate generation of a voltage reference $V_{REF1}$. Transistor $M_1$ comprises an input (source) terminal coupled to an upper-supply rail $V_{DD}$, a control (gate) terminal coupled to current source $I_1$, and an output (drain) terminal coupled to an input (source) terminal of feedback element $M_7$, while diode-connected transistor $M_2$ comprises an input (source) terminal coupled to a current source $I_1$ and an output (drain) terminal and a control (gate) terminal configured to facilitate generation of output-dependent voltage reference $V_{REF1}$.

Feedback loop 302 is configured to facilitate matching of the output (drain) voltages of transistor $M_1$ and output device $OUT_1$. For example, reference voltage $V_{REF1}$ is generated from gate-source voltages of transistors $M_1$ and $M_2$. In other words:

$$V_{REF1} = V_{GSM1} + V_{GSM2}$$

While the gate-source voltage $V_{GSM2}$ of transistor $M_2$ is a function of constant current source $I_1$, through feedback coupling of transistor $M_7$, the gate-source voltage $V_{GSM1}$ of transistor $M_1$ is a function of output voltage $V_{OUT}$, i.e., a function of the output (drain) voltage of output device $OUT_1$, as well as upper supply rail $V_{DD}$. Accordingly, variances in the output voltage and/or supply rail voltage levels will affect the gate-source voltage $V_{GSM1}$ of transistor $M_1$, thus suitably adjusting and/or controlling reference voltage $V_{REF1}$. As a result, suitable matching of output (drain) voltages of transistor $M_1$ and output device $OUT_1$ can be provided to suitably control and/or adjust to facilitate stability of quiescent current $I_q$.

While a PMOS-circuit 300 is illustrated, an exemplary output stage circuit can comprise an NMOS-circuit for operation of supply voltage when approaching negative supply rail $V_{SS}$, with another exemplary feedback loop comprising at least one feedback element coupled to an output device $OUT_2$ to generate an output-dependent reference voltage $V_{REF2}$. In addition to feedback element $M_7$, transistor $M_1$ and transistor $M_2$, feedback loop 302 can comprise other components and devices to facilitate control and/or adjustment of reference voltage $V_{REF1}$.

In accordance with another exemplary embodiment, an exemplary output stage circuit can comprise one or more clamp circuits configured to facilitate operation of the output stage circuit when the output supply is proximate to or exceeds a positive or a negative supply rail. For example, an exemplary clamp circuit can be configured to enable operation of an exemplary feedback loop when the output supply is within the supply rail voltages, and to prevent current saturation when the output supply reaches or exceeds the supply rail voltages and disables the exemplary feedback loop.

Figure 4:
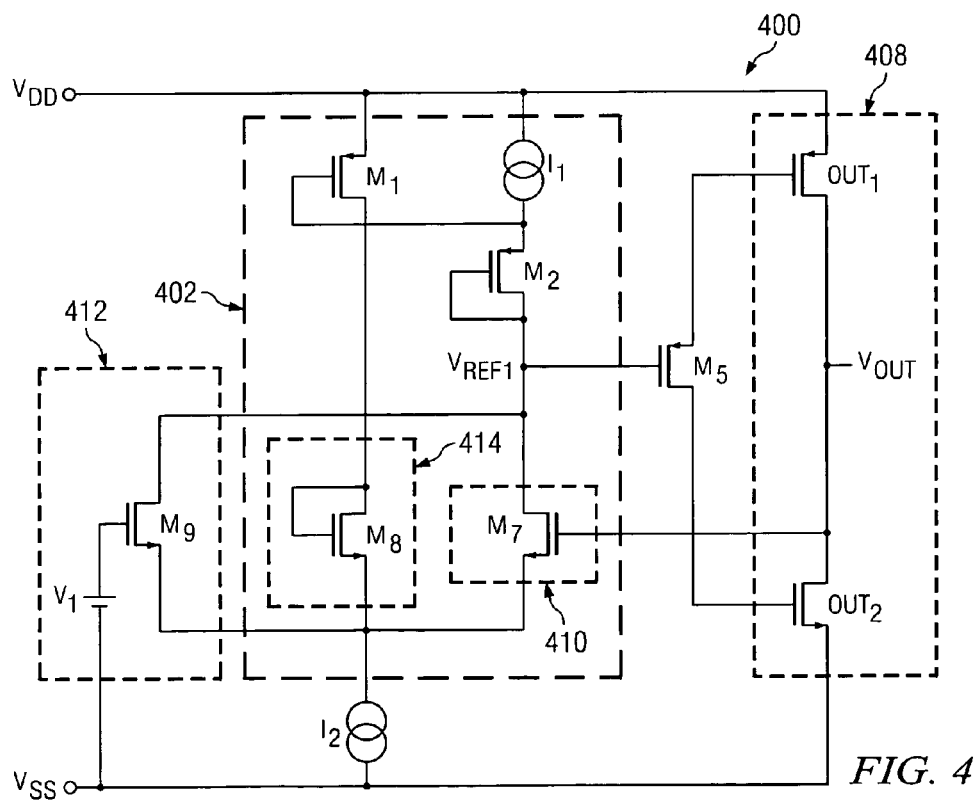
FIG. 4 illustrates a schematic diagram of an exemplary PMOS-side of an output stage circuit in accordance with another exemplary embodiment of the present invention.

With reference to FIG. 4, in accordance with an exemplary embodiment, a PMOS-side circuit 400 comprises a feedback loop 402 with at least one feedback-element 410 and a class-AB device $M_5$, an output device $OUT_1$, and a clamp circuit 412. In accordance with this exemplary embodiment, feedback loop 402 further comprises a diode-device 414 configured between the output (drain) terminal of transistor $M_1$ and input (source) terminal of feedback element $M_7$. Diode-device 414 can be configured in various manners and comprise various diode-configurations and diode devices. In the exemplary embodiment, diode-device 414 comprises diode-connected transistor $M_8$.

Clamp circuit 412 suitably comprises a transistor device $M_9$ configured in a parallel arrangement with feedback element $M_7$. Transistor $M_9$ has a control (gate) terminal coupled to lower supply rail $V_{SS}$ through a voltage source $V_1$, with an input (source) terminal and an output (drain) terminal coupled to the input (source) terminal and an output (drain) terminal of feedback element $M_7$, respectively.

During operation, when the output (drain) voltage of output device $OUT_1$ is proximate to or exceeds negative rail $V_{SS}$, for example by approximately one gate-source voltage (1 $V_{GS}$) above or below negative rail $V_{SS}$, and feedback element $M_7$ is not biased, feedback loop 402 is disabled. However, clamp circuit 412 operates to bypass feedback loop 402 to prevent current saturation of current source $I_2$. In other words, as the output (drain) voltage of output device $OUT_1$ is proximate to or is below negative rail $V_{SS}$, clamp circuit 412 provides an additional voltage source that facilitates operation safely without current saturation.

While clamp circuit 412 comprises transistor device $M_9$ in accordance with an exemplary embodiment, clamp circuit 412 can comprise any other clamp circuit configuration or other circuit configured to provide another voltage source, e.g., a voltage source greater than at least one gate-source voltage (1 $V_{GS}$) above feedback element $M_7$, when the output supply reaches or exceeds the supply rail voltages and disables exemplary feedback loop 402.

Figure 5:
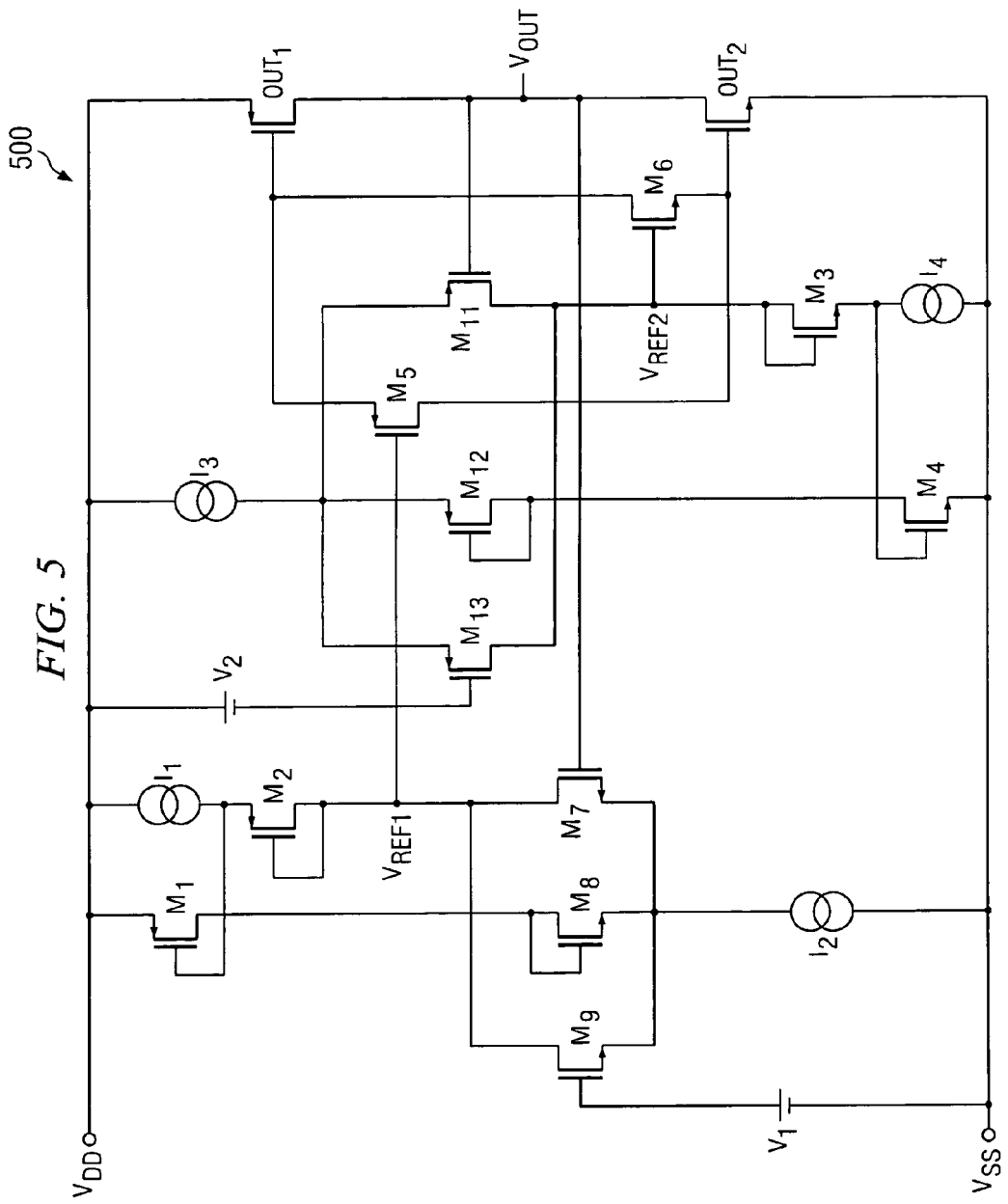
FIG. 5 illustrates a schematic diagram of another exemplary output stage circuit in accordance with an exemplary embodiment of the present invention.

In addition, while PMOS-circuits have been illustrated for simplicity purposes, an exemplary output stage circuit can suitably comprise both PMOS and NMOS-circuit configurations. For example, with reference to FIG. 5, in accordance with an exemplary embodiment, an exemplary output stage circuit 500 suitably comprises a class-AB circuit comprising transistors $M_5$ and $M_6$, a pair of feedback loops, e.g., a first feedback loop comprising transistor $M_1$, diode-device $M_8$, feedback element $M_7$ and transistor $M_2$, and a second feedback loop comprising transistor $M_4$, diode-device $M_{12}$, feedback element $M_{11}$ and transistor $M_3$, and a pair of clamp circuits comprising transistor $M_9$ and transistor $M_{13}$. Further, while exemplary output stage circuit 500 illustrates a pair of clamp circuits and diode-devices within both a PMOS-circuit and NMOS-circuit, output stage circuit 500 can be provided with only a single clamp circuit and diode-device within one of a PMOS-circuit and NMOS-circuit, with the other PMOS-circuit or NMOS-circuit without any clamp circuits or diode-devices.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing bipolar or JFET devices for the various devices. In addition, one or more additional stages may be included at the input or output stages in accordance with various exemplary embodiments. Further, the various exemplary embodiments can be implemented with other types of operational amplifier circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

This invention claimed is:

1. An output stage circuit configured to provide stable quiescent current, said output stage circuit comprising:
   a class-AB device;
   an output device configured for providing an output voltage, said output device coupled to said class-AB device;
   a feedback loop configured for controlling a reference voltage for said class-AB device; and
   a feedback element having a control terminal directly coupled to an output terminal of said output device.

2. The output stage circuit according to claim 1, wherein said feedback loop is configured for controlling said reference voltage based on said output voltage.

3. An output stage circuit configured to provide stable quiescent current, said output stage circuit comprising:
   a class-AB device;
   an output device configured for providing an output voltage, said output device coupled to said class-AB device; and
   a feedback loop configured for controlling a reference voltage for said class-AB device,
   wherein said feedback loop further comprises a first transistor device and a second transistor device, said first transistor device having an output terminal coupled to an input terminal of a feedback element and a control terminal coupled to an input terminal of said second transistor device, said second transistor device having a control terminal and an output terminal coupled to a control terminal of said class-AB device.

4. The output stage circuit according to claim 3, wherein said output terminal of said first transistor device is coupled through a diode-device to said input terminal of said feedback element.

5. The output stage circuit according to claim 3, wherein said feedback element comprises an output terminal coupled to a control terminal of said class-AB device.

6. The output stage circuit according to claim 1, wherein said output stage circuit further comprises a clamp circuit configured to facilitate operation of said output stage circuit when said output voltage is proximate to a supply rail voltage.

7. An output stage circuit configured to provide stable quiescent current, said output stage circuit comprising:
   a class-AB device;
   an output device configured for providing an output voltage, said output device coupled to said class-AB device;
   a feedback loop configured for controlling a reference voltage for said class-AB device; and
   a feedback element having a control terminal directly coupled to an output terminal of said output device,
   wherein said output stage circuit further comprises a clamp circuit configured to facilitate operation of said output stage circuit when said output voltage is proximate to a supply rail voltage, and
wherein said clamp circuit is configured in parallel with said feedback element of said feedback loop.

8. The output stage circuit according to claim 7, wherein said clamp circuit comprises a transistor device having a control terminal coupled to a voltage source, an input terminal coupled to an input terminal of said feedback element, and an output terminal coupled to an output terminal of said feedback element.

9. The output stage circuit according to claim 1, wherein said class-AB device, said output device and said feedback loop are configured for control of a PMOS-side circuit, and said output stage further comprises an NMOS-side circuit comprising:
  a second class-AB device;
  a second output device configured for providing said output voltage, said second output device coupled to said second class-AB device; and
  a second feedback loop configured for controlling a second reference voltage for said second class-AB device.

10. The output stage circuit according to claim 1, wherein said output device comprises a minimum-length device to facilitate at least one of higher speed and capacitive load handling capability.

11. An operational amplifier circuit comprising an input stage circuit and an output stage circuit configured to provide stable quiescent current, said output stage circuit comprising:
  an output device configured for providing an output voltage;
  a class-AB device configured to control said output device; and
  a control circuit configured for controlling a reference voltage for said class-AB device based on said output voltage,
  wherein said control circuit comprises a feedback element having a control terminal directly coupled to an output terminal of said output device, and
  wherein said control circuit further comprises a first transistor device and a second transistor device, said first transistor device having an output terminal coupled to an input terminal of said feedback element and a control terminal coupled to an input terminal of said second transistor device, said second transistor device having a control terminal and an output terminal coupled to a control terminal of said class-AB device.

12. The operational amplifier circuit according to claim 11, wherein said input terminal of said second transistor device is coupled to a current source.

13. The operational amplifier circuit according to claim 11, wherein said feedback element comprises an output terminal coupled to said control terminal of said class-AB device.

14. The operational amplifier circuit according to claim 11, wherein said output stage circuit further comprises a clamp circuit configured to facilitate operation of said output stage circuit when said output voltage is either proximate to or exceeds a supply rail voltage.

15. An operational amplifier circuit comprising an input stage circuit and an output stage circuit configured to provide stable quiescent current, said output stage circuit comprising:
  an output device configured for providing an output voltage;
  a class-AB device configured to control said output device; and
  a control circuit configured for controlling a reference voltage for said class-AB device based on said output voltage,
  wherein said output stage circuit further comprises a clamp circuit configured to facilitate operation of said output stage circuit when said output voltage is either proximate to or exceeds a supply rail voltage, and
  wherein said clamp circuit is configured in parallel with a feedback element of said control circuit.

16. The operational amplifier circuit according to claim 11, wherein said output terminal of said first transistor device is coupled through a diode device to said input terminal of said feedback element.

17. The operational amplifier circuit according to claim 15, wherein said clamp circuit comprises a transistor device having a control terminal coupled to a voltage source, an input terminal coupled to an input terminal of said feedback element, and an output terminal coupled to an output terminal of said feedback element.

18. The operational amplifier circuit according to claim 11, wherein said class-AB device, said output device and said control circuit are configured for control of a PMOS-side circuit, and said output stage further comprises an NMOS-side circuit comprising:
  a second class-AB device;
  a second output device configured for providing said output voltage, said second output device coupled to said second class-AB device; and
  a second control circuit configured for controlling a second reference voltage for said second class-AB device.

19. The output stage circuit according to claim 11, wherein said output device comprises a minimum-length device to facilitate at least one of higher speed and capacitive load handling capability.

20. An output stage circuit configured to provide stable quiescent current, said output stage circuit comprising:
  a first class-AB device comprising a PMOS transistor, and a second class-AB device comprising an NMOS transistor;
  a first output device and a second output device having output terminals coupled together and configured for providing an output voltage, said first output device coupled to said first PMOS-based class-AB device and said second output device coupled to said NMOS-based class-AB device; and
  a first feedback loop configured for generating a first reference voltage for said PMOS-based class-AB device based on a level of output voltage supply a second feedback loop configured for controlling a second reference voltage for said NMOS-based class-AB device based on said level of output voltage supply,
  wherein said output stage circuit further comprises a first clamp circuit configured to facilitate operation of said output stage circuit when said output voltage is proximate to a lower supply rail voltage, and a second clamp circuit configured to facilitate operation of said output stage circuit when said output voltage is proximate to an upper supply rail voltage.

21. The output stage circuit according to claim 20, wherein said first clamp circuit is configured in parallel with a first feedback element of said first feedback loop, and said second clamp circuit is configured in parallel with a second feedback element of said second feedback loop.

* * * * *